(12) United States Patent
Viredaz et al.

(10) Patent No.: US 7,373,268 B1
(45) Date of Patent: May 13, 2008

(54) METHOD AND SYSTEM FOR DYNAMICALLY CONTROLLING COOLING RESOURCES IN A DATA CENTER

(75) Inventors: Marc A. Viredaz, Sunnyvale, CA (US); Salil Pradhan, Santa Clara, CA (US); Malena Mesarina, Menlo Park, CA (US); Geoff M. Lyon, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 41 days.

(21) Appl. No.: 10/632,311

(22) Filed: Jul. 30, 2003

(51) Int. Cl.
*G06F 1/16* (2006.01)
(52) U.S. Cl. .................................................. 702/130
(58) Field of Classification Search ................ 702/130, 702/60, 136; 62/180, 229, 259.2; 361/687, 361/688
See application file for complete search history.

(56) References Cited

U.S. PATENT DOCUMENTS

| | | | | |
|---|---|---|---|---|
| 4,379,483 A | | 4/1983 | Farley | |
| 5,404,270 A | * | 4/1995 | Carlstedt | 361/689 |
| 6,198,245 B1 | * | 3/2001 | Du et al. | 318/471 |
| 2003/0115000 A1 | * | 6/2003 | Bodas | 702/60 |
| 2003/0193777 A1 | * | 10/2003 | Friedrich et al. | 361/687 |
| 2004/0264124 A1 | * | 12/2004 | Patel et al. | 361/686 |

* cited by examiner

Primary Examiner—Tung S. Lau

(57) ABSTRACT

The present invention includes a method and system for dynamically controlling cooling resources in a data center based on the workload of the data center. Accordingly, based on the workload constraints (power consumed, latency, etc.) of the data center, each of a plurality of different types of cooling resources is activated in an optimal fashion. Consequently, a substantial savings in operational costs related to cooling resources is achieved. A first aspect of the present invention is a method for dynamically controlling cooling resources in a data center. The method comprises determining a workload within the data center, determining an amount of heat being generated as a function of the workload and activating each of a plurality of different types of cooling resources within the data center in an optimal fashion based on the amount of heat being generated.

24 Claims, 5 Drawing Sheets

METHOD AND SYSTEM FOR DYNAMICALLY CONTROLLING COOLING RESOURCES IN A DATA CENTER

FIELD OF THE INVENTION

The present invention relates generally to cooling systems for data centers and particularly to a method and system for dynamically controlling the cooling resources in a data center.

BACKGROUND OF THE INVENTION

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) high, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, microcontrollers, high speed video cards, memories, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause its temperature to exceed a predetermined temperature range. Consequently, conventional cooling systems often incur greater amounts of operating expenses than may be necessary to sufficiently cool the heat generating components contained in the racks of data centers.

Accordingly, what is needed is a cooling system that can be dynamically controlled based on the actual cooling requirements of the associated data center. The cooling system should be simple, inexpensive and capable of being easily adapted to existing technology. The present invention addresses these needs.

SUMMARY OF THE INVENTION

The present invention includes a method and system for dynamically controlling cooling resources in a data center. The present invention dynamically controls a plurality of different types of cooling resources within a data center based on the workload constraints (power consumed, latency, etc.) of the data center. Accordingly, each of the plurality of different types of cooling resources is activated in an optimal fashion based on the workload constraints. As a result of the use of the method and system in accordance with embodiments of the present invention, a substantial savings in operational costs related to cooling resources is achieved.

A first aspect of the present invention is a method for dynamically controlling cooling resources in a data center. The method comprises determining a workload within the data center, determining an amount of heat being generated as a function of the workload and activating each of a plurality of different types of cooling resources coupled to the data center in an optimal fashion based on the amount of heat being generated.

A second aspect of the present invention is a system for dynamically controlling cooling resources in a data center. The system includes means for determining a workload within the data center means for determining an amount of heat being generated as a function of the workload and means for activating each of a plurality of different types of cooling resources within the data center in an optimal fashion based on the amount of heat being generated.

A third aspect of the present invention is a data center. The data center includes a global computer system, a plurality of different types of cooling resources coupled to the global computer system and a cooling resource control module coupled to the global computer system and the plurality of different types of cooling resources wherein the cooling resource control module includes logic for: determining a workload for the global computer system, determining an amount of heat being generated as a function of the workload and activating each of a plurality of different types of cooling resources coupled to the global computer system in an optimal fashion based on the amount of heat being generated.

A fourth aspect of the present invention is a cooling resource control module for a data center. The cooling resource control module comprises determination logic for determining a workload within the data center and determining an amount of heat being generated as a function of the workload and activation logic for activating each of a plurality of different types of cooling resources within the data center in an optimal fashion based on the amount of heat being generated.

Other aspects and advantages of the present invention will become apparent from the following detailed description, taken in conjunction with the accompanying drawings, illustrating by way of example the principles of the invention.

DETAILED DESCRIPTION

Figure 1:
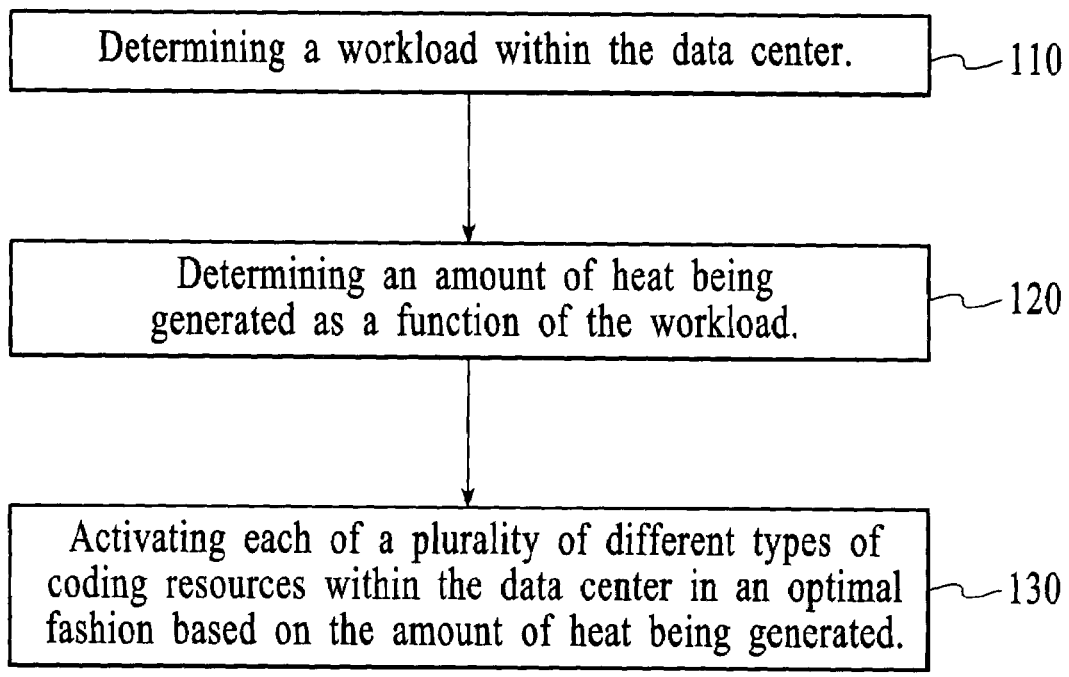
FIG. 1 is a high-level flow chart of a method in accordance with an embodiment of the present invention.

The present invention relates to a method and system for dynamically controlling cooling resources in a data center. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, the present invention is a method and system for dynamically controlling cooling resources in a data center. The present invention dynamically controls a plurality of different types of cooling resources within a data center based on the workload of the data center. Accordingly, each of the plurality of different types of cooling resources is activated in an optimal fashion based on the workload. As a result of the use of the method and system in accordance with embodiments of the present invention, a substantial savings in operational costs related to cooling resources is achieved.

FIG. 1 is a high level flow chart of a method in accordance with an embodiment of the present invention. A first step 110 includes determining a workload within the data center. A next step 120 includes determining an amount of heat being generated as a function of the workload. A final step 130 includes activating each of a plurality of different types of cooling resources within the data center in an optimal fashion based on the amount of heat being generated. In an embodiment, the optimal fashion is based on a cost associated with the activation of each of the plurality of different types of cooling resources.

The above-described embodiment of the invention may also be implemented, for example, by operating a computer system to execute a sequence of machine-readable instructions. The instructions may reside in various types of computer readable media. In this respect, another aspect of the present invention concerns a programmed product, comprising computer readable media tangibly embodying a program of machine-readable instructions executable by a digital data processor to perform the method in accordance with an embodiment of the present invention.

This computer readable media may comprise, for example, RAM contained within the system. Alternatively, the instructions may be contained in another computer readable media and directly or indirectly accessed by the computer system. Whether contained in the computer system or elsewhere, the instructions may be stored on a variety of machine readable storage media, such as a Direct Access Storage Device (DASD) (e.g., a conventional "hard drive" or a RAID array), magnetic data storage diskette, magnetic tape, electronic non-volatile memory, an optical storage device (for example, CD ROM, WORM, DVD,), or other suitable computer readable media including transmission media such as digital, analog, and wireless communication links. In an illustrative embodiment of the invention, the machine-readable instructions may comprise lines of compiled C, C++, or similar language code commonly used by those skilled in the programming for this type of application arts.

Figure 2:
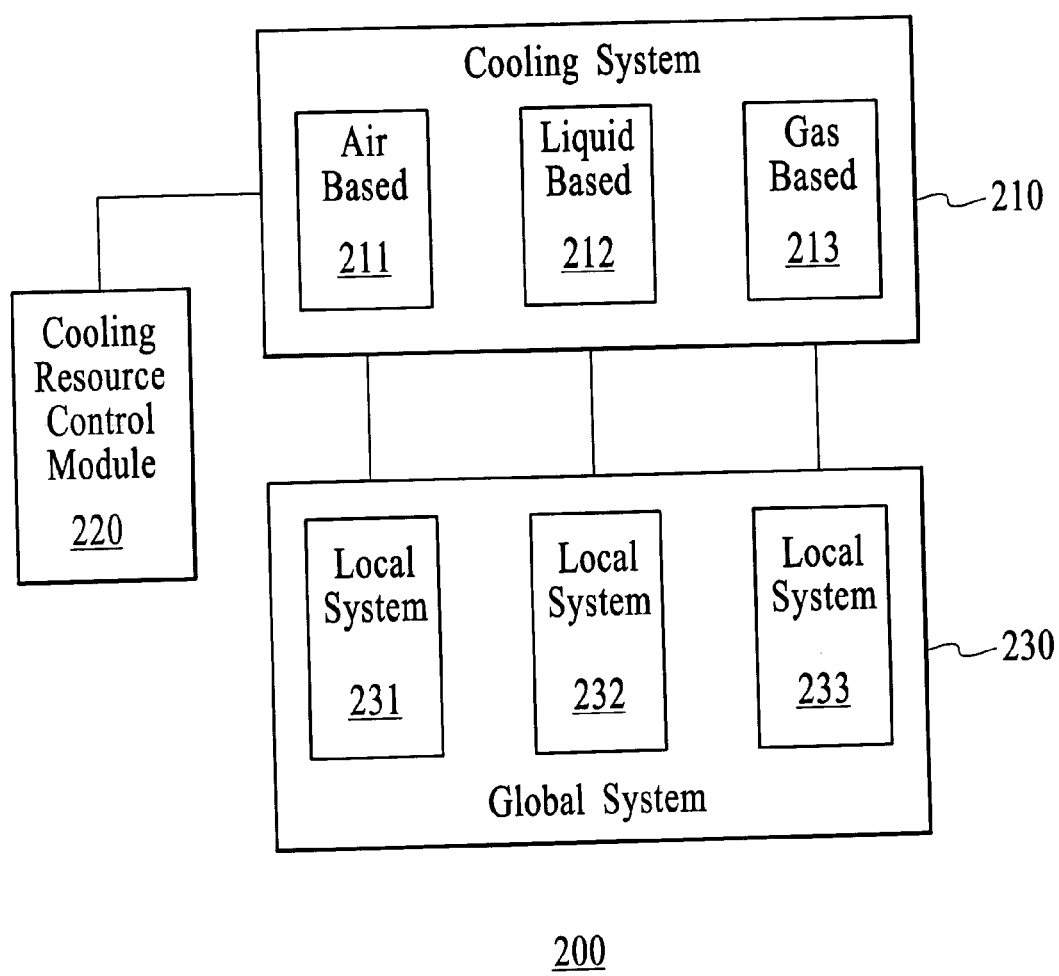
FIG. 2 is an illustration of a system in accordance with an embodiment of the present invention.

FIG. 2 is a high-level illustration of a system 200 in accordance with an embodiment of the present invention. The system 200 includes a cooling system 210, a cooling resource control module 220 and a global computer system 230. The cooling resource control module 220 is coupled to the cooling system 210 and the global computer system 230. The cooling system 210 is coupled to the global computer system 230.

The cooling system 210 includes a plurality of different types of cooling resources 211-213. In an embodiment of the present invention, a first type of cooling resource 211 is an air-based cooling resource, a second type of cooling resource 212 is a liquid-based cooling resource and a third type of cooling resource 213 is a gas-based cooling resource.

For the purposes of this patent application, the air-based cooling resource 211 could be a computer room air condition (CRAC) system and fans, vents, air ducts or the like for distributing cool air. A liquid-based cooling resource 212 could include a series of pipes or the like configured above or below the global computer system 230 wherein a cooling fluid (water or the like) is distributed therethrough for the purpose of cooling the global computer system 230. Similarly, a gas-based cooling resource 213 could also include a series of pipes or the like configured within proximity of the global computer system 230 wherein a gas (e.g. Freon) is distributed therethrough for the purpose of cooling the global computer system 230.

Although the above-disclosed embodiment is described as being utilized in conjunction with three different types of cooling resources one of ordinary skill in the art will readily recognize that a variety of the different types of cooling resources could be employed while remaining within the spirit and scope of the present invention.

Figure 3:
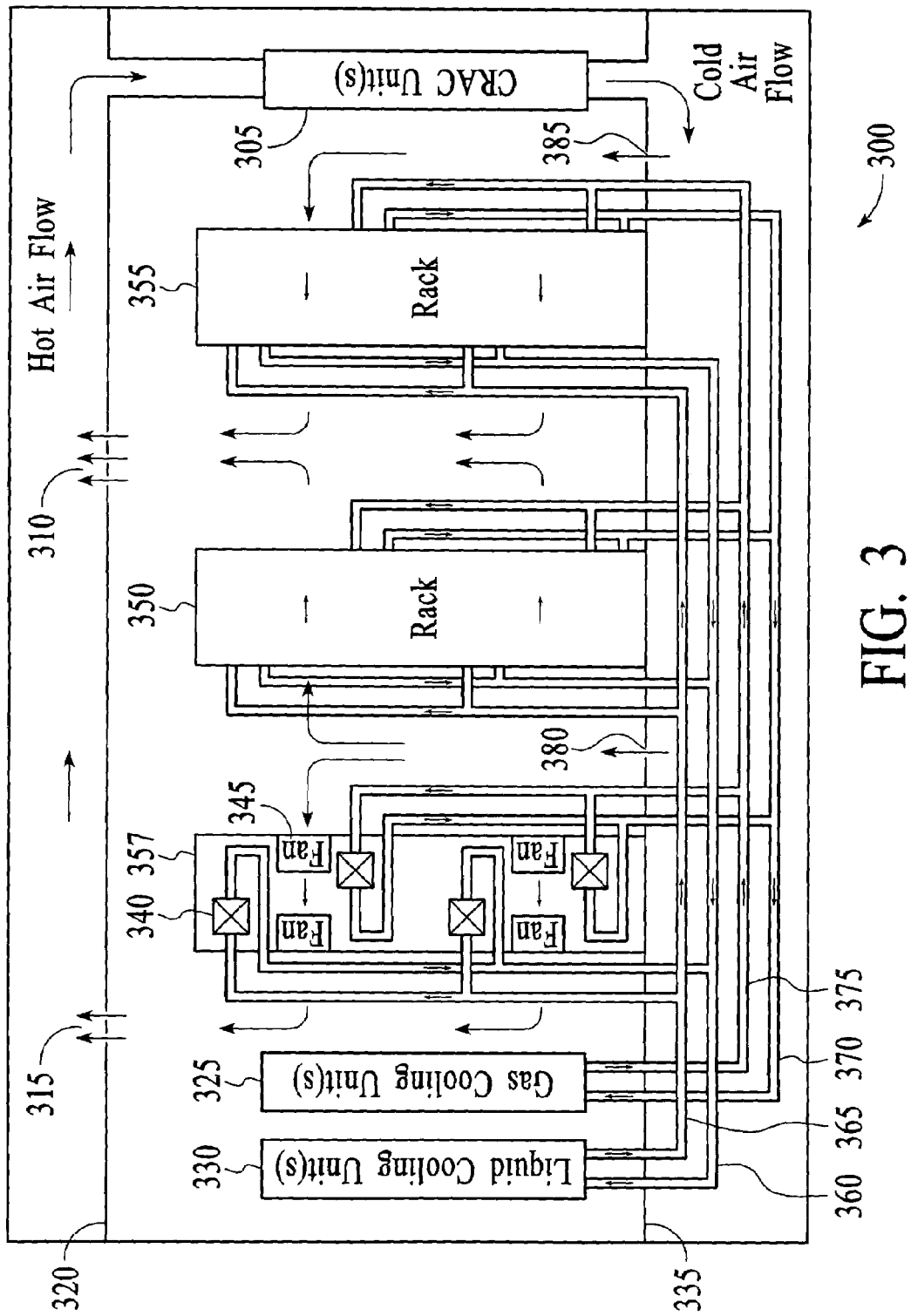
FIG. 3 is a perspective view of the system in accordance with an embodiment of the present invention.

FIG. 3 shows an example of a system 300 in accordance with an embodiment of the present invention. In this particular embodiment, the system 300 is a data center. The system includes a CRAC unit 305, a gas-based cooling unit 325, a liquid-based cooling unit 330 and computer racks 350, 355, 357. A ceiling 320 includes ceiling vents 310, 315 and a floor 335 includes floor vents 380, 385. The gas-based cooling unit 325 is connected to input piping 370 and output piping 375 for respectively receiving and distributing a gas-based coolant. Similarly, the liquid-based cooling unit 330 includes to input piping 360 and output piping 365 for respectively receiving and distributing a liquid-based coolant.

During operation, heat is generated from the computer racks 350, 355, 357 as a function of the corresponding workload(s) thereof. This causes the air temperature to increase. As the air temperature increases, the heated air flows through the ceiling vents 310, 315 and into the CRAC unit 305 where it is subsequently cooled. The cooled air is then distributed through the floor vents 380, 385 thereby cooling the computer racks 350, 355, 357.

With regard to the gas-based cooling unit 325, once activated, a cooling gas is distributed via output piping 375 thereby cooling the computer racks 350, 355, 357. Consequently, as heat is removed from the computer racks 350, 355, 357, the heat of the gas increases. This heated gas is then channeled back to the gas-based cooling unit 325 via input piping 370 where it is cooled and redistributed through the output piping 375. In an embodiment, the gas-based cooling unit 325 implements a refrigeration cycle.

Similarly, with regard to the liquid-based cooling unit 330, once activated, a cooling liquid is distributed via output piping 365 thereby cooling the computer racks 350, 355, 357. Consequently, as heat is removed from the computer racks 350, 355, 357, the heat of the liquid increases. This heated liquid is then channeled back to the liquid-based cooling unit 330 via input piping 360 where it is cooled and redistributed through the output piping 365.

Furthermore, a plurality of fans 345 are included to direct the flow of cool air to the various components of the computer racks 350, 355, 357. Also, a plurality of valves 340 are implemented to control respective flows of the gas and liquid to and from the gas-based cooling unit 325 and the liquid-based cooling unit 330. For the purpose of this illustration, valves are shown placed on the input piping, but could be placed elsewhere as well. (Although, fans 345 and valves 340 are shown with the respect to computer rack 357, it should be understood that racks 350 and 355 implement a similar fan/valve configuration.)

A cooling resource module (not shown in FIG. 3) controls the activation/deactivation of each of the cooling resources in the system 300. This could involve activating the cooling resources one unit at a time or activating all of the cooling units and dynamically controlling each unit whereby system cooling can be selectively routed through the operation of the fans 345 and valves 340.

For example, if computer rack 350 is the only rack that requires cooling, the CRAC unit 305, the gas-based unit 325 and the liquid-based unit 330 can each be activated. Accordingly, the cooling resource module can dynamically control the valves 340 and fans 345 whereby computer rack 350 is the only rack being cooled. Furthermore, any other control mechanism could be used instead or in addition to the fans 345 and valves 340. For instance, the floor vents 380, 385 and the ceiling vents 310, 315 could also be dynamically controlled by the cooling resource control module.

Figure 4:
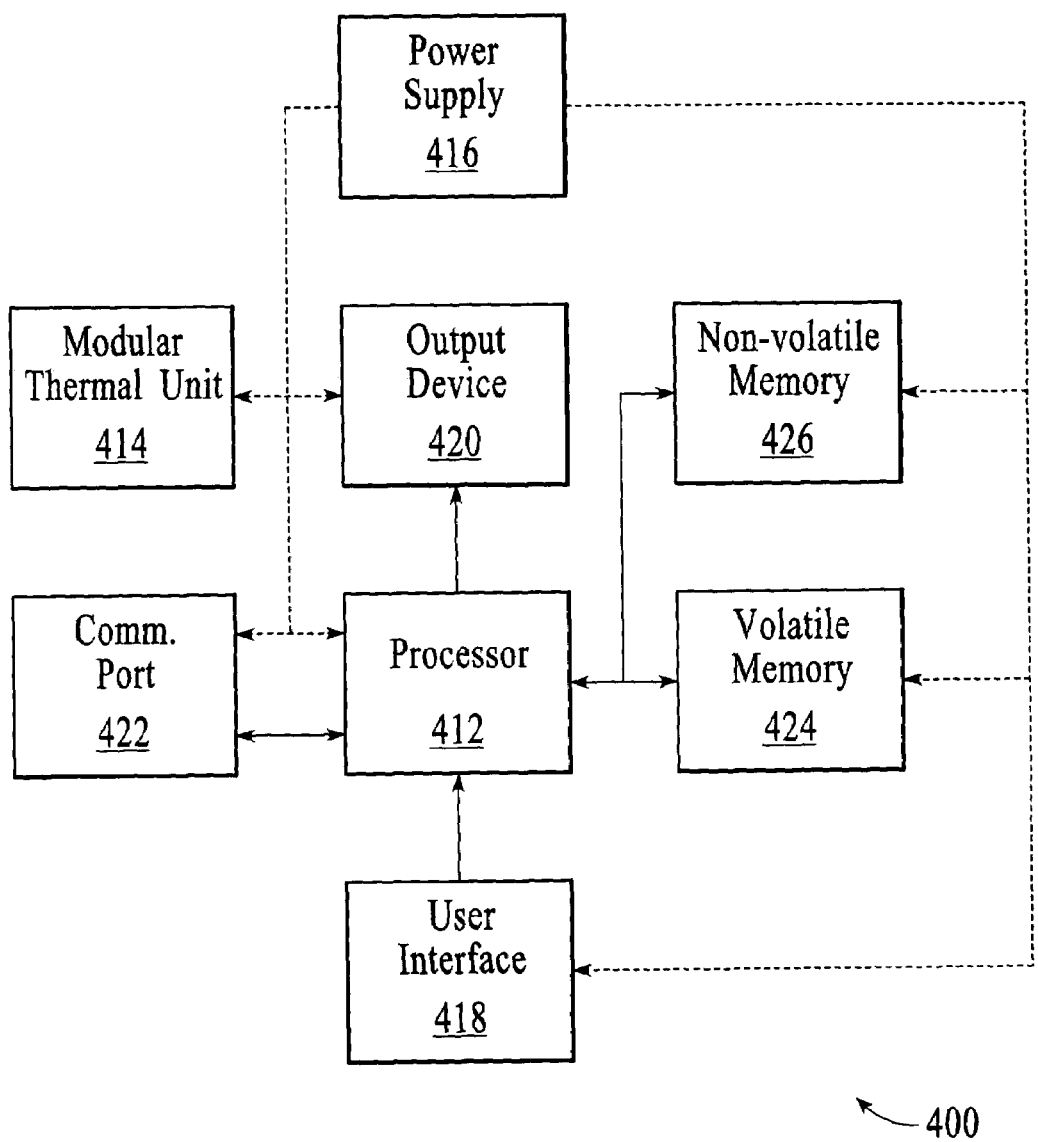
FIG. 4 is a block diagram of a computer system that could be utilized in conjunction with an embodiment of the present invention.

In an embodiment of the present invention, the cooling resource control module may be implemented as one or more respective software modules operating on a computer system. For an example of such a computer system, please refer to FIG. 4. In FIG. 4, a block diagram of a computer system, generally designated by the reference numeral 400, is featured. Computer 400 may be any of a variety of different types, such as a notebook computer, a desktop computer, an industrial personal computer, an embedded computer, etc. In the illustrated embodiment, a processor 412 controls the functions of computer system 400. In this embodiment, data, as illustrated by the solid line, is transferred between the processor 412 and the components of system 400. Additionally, a modular thermal unit 414 is used to remove heat from the processor 412. Computer 400 also includes a power supply 416 to supply electrical power, as illustrated by the dashed line, to the components of computer system 400. Additionally, power supply 416 may include a battery.

Computer system 400 may incorporate various other components depending upon the desired functions of computer 400. In the illustrated embodiment, a user interface 418 is coupled to processor 412. Examples of a user interface 418 include a keyboard, a mouse, and/or a voice recognition system. Additionally, an output device 420 is coupled to processor 412 to provide a user with visual information. Examples of an output device 420 include a computer monitor, a television screen, a printer or the like. In this embodiment a communications port 422 is coupled to processor 412 to enable the computer system 400 to communicate with an external device or system, such as a printer, another computer, or a network.

Processor 412 utilizes software programs to control the operation of computer 400. Electronic memory is coupled to processor 412 to store and facilitate execution of the programs. In the illustrated embodiment, processor 412 is coupled to a volatile memory 424 and non-volatile memory 426. A variety of memory types, such as DRAMs, SDRAMs, SRAMs, etc., may be utilized as volatile memory 424. Non-volatile memory 426 may include a hard drive, an optical storage, or another type of disk or tape drive memory. Non-volatile memory 426 may include a read only memory (ROM), such as an EPROM, to be used in conjunction with volatile memory 424.

The system 400 may also be utilized in conjunction with a distributed computing environment where tasks are performed by remote processing devices that are linked through a communications network. In a distributed computing environment, program modules may be located in both local and remote memory storage devices. Execution of the program modules may occur locally in a stand-alone manner or remotely in a client/server manner. Examples of such distributed computing environments include local area networks of an office, enterprise-wide computer networks, and the Internet. Additionally, the networks could communicate via wireless means or any of a variety of communication means while remaining within the spirit and scope of the present invention.

Referring back to FIG. 2, the global computer system 230 includes a plurality of local systems 231-233. The illustration of three local systems 231-233 is for illustrative and simplicity of description purposes only and is not intended to limit the present invention in any respect. The local systems 231-233 generally house a plurality of components (not shown), e.g., processors, micro-controllers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because computer rack systems have been generally known to include upwards of forty (40) or more subsystems, they may require substantially large amounts of cooling resources to maintain the subsystems and the components generally within a predetermined operating temperature range.

Figure 5:
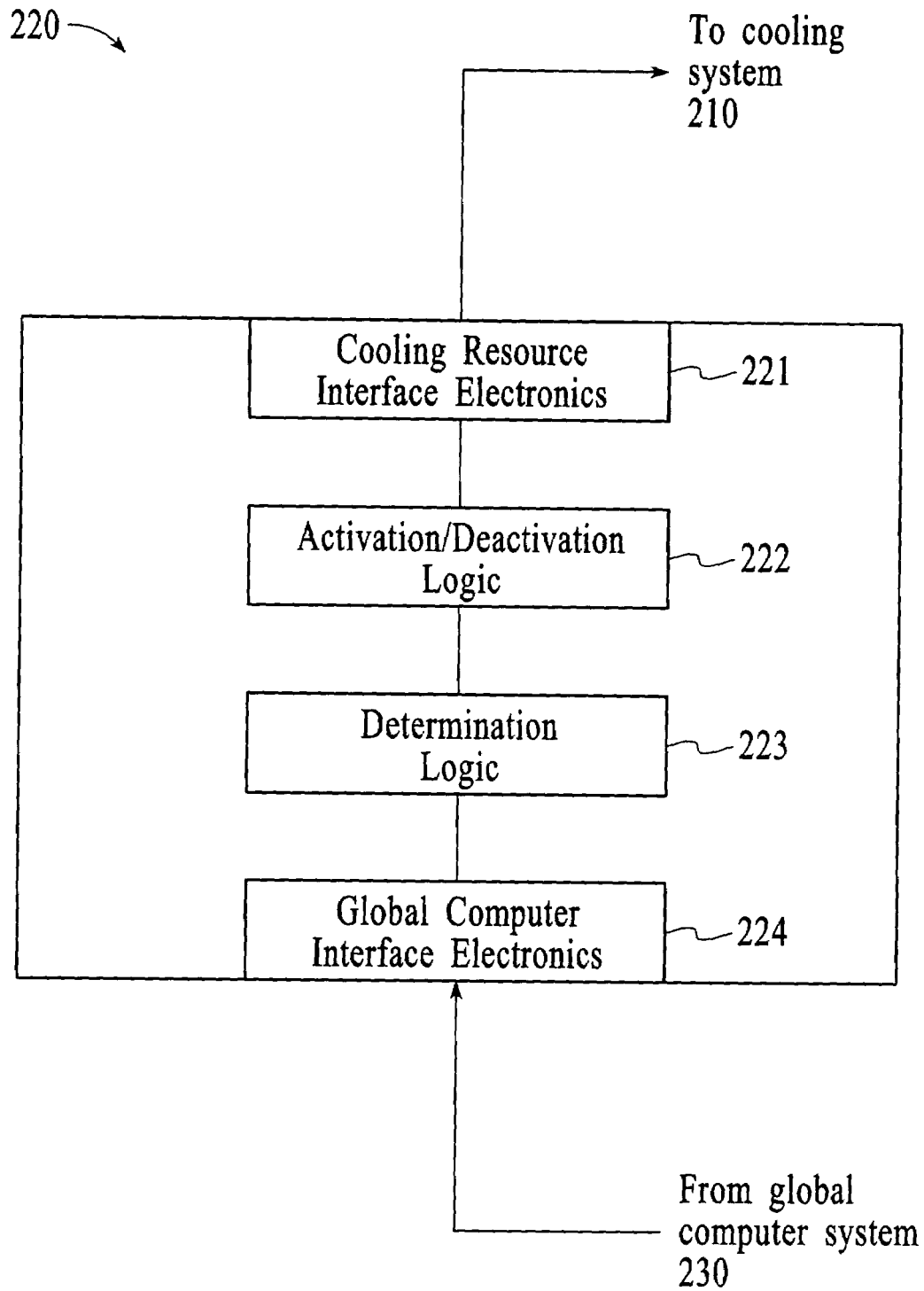
FIG. 5 shows a more detailed illustration of a cooling resource control module in accordance with an embodiment of the present invention.

In accordance with an embodiment of the present invention, the cooling resource control module 220 activates each of the plurality of different types of cooling resources 211-213 within the cooling system 210 based on the cooling needs of the local systems 231-233 within the global computer system 230. FIG. 5 shows a more detailed illustration of the cooling resource control module 220 in accordance with an embodiment of the present invention. The cooling resource control module 220 includes cooling resource interface electronics 221, cooling resource activation/deactivation logic 222, determination logic 223 and global computer system interface electronics 224. The cooling resource interface electronics 221 are coupled to the cooling resource activation/deactivation logic 222 wherein the cooling resource activation/deactivation logic 222 is further coupled to the determination logic 223. The determination logic 223 is further is coupled to the global computer system interface electronics 224.

Although the components of the above-described cooling resource control module 220 are shown in a specific configuration, one of ordinary skill in the art will readily recognize the components of the cooling resource control module 220 could be configured in a variety of ways while remaining within the spirit and scope of the present invention.

The cooling resource interface electronics 221 and the global computer system interface electronics 224 include the electronic circuitry employed by the cooling resource control module 220 to respectively communicate with the cooling resource system 210 and the global computer system 230. Activation/deactivation logic 222 contains logic for activating and deactivating each of the plurality of cooling resources in the cooling system 210.

Determination logic 223 includes logic for determining the workload of the global computer system 230. This can be accomplished with application software located within the global computer system 230. By determining the workload of the global computer system 230, the amount of power required to execute the workload can be determined. Consequently, the amount of heat being dissipated by the global computer system 230 can then be determined as a function of the amount of power required to execute the workload. Consequently, the cooling resource needs of the global computer system 230 can be ascertained based on the amount of heat being dissipated by the global computer system 230.

The determination logic 223 includes information related to each of the plurality of cooling resources in the cooling system 210. This information includes cooling resource parameters such as the amount of heat that can be removed by each of the plurality of different cooling resources, the operational cost of each of the plurality of cooling resources, etc. Accordingly, the determination logic 223 can determine which of the plurality of different resources needs to be activated/deactivated based on the parameters of each of the plurality of cooling resources.

In an embodiment of the present invention, the plurality of cooling resources 211-213 are activated in an optimal fashion wherein the optimal fashion is based on a cost associated with the operation of each of the plurality of different cooling resources 211-213. For example, operating an air-based cooling resource is cheaper than operating a liquid-based cooling resource and operating a liquid-based cooling resource is cheaper than operating a gas-based cooling resource. Accordingly, if the optimal order of cooling resource activation is based on a cost associated with the operation of the cooling resource, the air-based cooling resource is activated first. Once the determination logic 223 determines that the amount of heat being dissipated by the global computer system 230 (based on the workload) exceeds the maximum amount of heat that can be removed by the air-based system, the determination logic 223 will trigger the activation/deactivation logic 222 to activate the next cooling resource in the optimal order i.e. the liquid-based cooling resource.

Furthermore, once the determination logic 223 determines that the amount of heat being dissipated by the global computer system 230 (based on the workload) exceeds the maximum amount of heat that can be removed by the air-based system and the liquid based system, the determination logic 223 will trigger the activation/deactivation logic 222 to activate the next cooling resource in the optimal order i.e. the gas-based cooling resource.

Additionally, the determination logic 223 can determine whether to deactivate one or more of the cooling resources 211-213 based on a reduction in the workload of the global computer system 230. For example, if two cooling resources are being utilized to remove heat from the global computer system 230 and the determination logic 223 ascertains that two cooling resources are no longer needed to keep the global computer system 230 within a predetermined operating temperature range, the determination logic 223 can trigger the activation/deactivation logic 222 to deactivate one or more of the cooling resources based on the amount of heat being generated by the current workload of the global computer system 230.

Although the above-described embodiment of the present invention is disclosed in the context of activating the cooling resources in an optimal fashion based on the operational cost of the associated cooling resource, one of ordinary skill in the art will readily recognize that the optimal fashion could be based on a variety of different factors while remaining within the spirit and scope of the present invention. For example, the cooling resources could be activated based on the amount of heat that can be removed by the respective cooling resource, e.g. the cooling resource with highest cooling capacity is turned on last.

A method and system for dynamically controlling cooling resources in a data center is disclosed. The present invention dynamically controls a plurality of different types of cooling resources within a data center based on the workload of the data center. Accordingly, each of the plurality of different types of cooling resources is activated in an optimal fashion based on the workload. As a result of the use of the method and system in accordance with embodiments of the present invention, a substantial savings in operational costs related to cooling resources is achieved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for dynamically controlling cooling systems in a data center comprising:
    determining a workload within the data center;
    determining an amount of heat being generated as a function of the workload, and activating each of a plurality of different types of separates cooling systems within the data center in an optimal fashion based on the heat being generated, wherein the plurality of separate cooling systems comprises an air-based cooling system, a liquid-based cooling system and a gas-based cooling system.

2. The method of claim 1 wherein the optimal fashion is based on a cost associated with the activation of each of the plurality of different cooling systems.

3. The method of claim 1 wherein the method further comprises:
deactivating one or more of the activated plurality of different types of cooling systems within the data center based on a reduction in the amount of power being consumed by the workload.

4. The method of claim 1 wherein the amount of heat being generated is a function of an amount of power being consumed by the data center.

5. The method of claim 4 wherein each of the plurality of cooling systems has a cooling capability wherein the cooling capability is a function of an amount of heat that can be removed by the cooling system and the act of activating each of a plurality of different cooling systems in an optimal fashion further comprises:
activating each of a plurality of different cooling systems based on the amount of heat that can be removed by each of the plurality of cooling systems.

6. The method of claim 1 wherein the act of activating each of a plurality of different cooling systems within the data center in an optimal fashion further comprises:
activating the air-based cooling system before the liquid-based cooling system and the gas-based cooling system; and
activating the liquid-based cooling system before the gas-based cooling system.

7. A system for dynamically controlling cooling systems in a data center comprising:
means for determining a workload within the data center;
means for determining an amount of heat being generated as a function of the workload, and
means for activating each of a plurality of different types of separate cooling systems coupled within the data center in an optimal fashion based on the amount of heat being generated, wherein the plurality of separate cooling systems comprises an air-based cooling system, a liquid-based cooling system and a gas-based cooling system.

8. The system of claim 7 wherein the method further comprises:
means for deactivating one or more of the activated plurality of different types of cooling systems within the data center based on a reduction in the amount of heat being generated.

9. The system of claim 7 wherein the amount of heat being generated is a function of an amount of power being consumed by the data center.

10. The system of claim 7 wherein each of the plurality of cooling systems has a cooling capability wherein the cooling capability is a function of an amount of heat that can be removed by the cooling system and the means for activating each of a plurality of different cooling systems in an optimal fashion further comprises:
means for activating each of a plurality of different cooling systems based on the amount of heat that can be removed by each of the plurality of cooling systems.

11. The system of claim 7 wherein the means for activating each of a plurality of different cooling systems within the data center in an optimal fashion further comprises:
means for activating the air based cooling system before the liquid based cooling system and the gas based cooling system; and
means for activating the liquid based cooling system before the gas based cooling system.

12. A data center comprising:
a global computer system;
a plurality of different cooling systems coupled to the global computer system; and
a cooling system control module coupled to the global computer system and the plurality of different cooling system wherein the cooling system control module includes logic for:
determining a workload within the global computer system;
determining an amount of heat being generated as a function of the workload; and
activating each of a plurality of different types of separate cooling systems coupled to the global computer system in an optimal fashion based on the amount of heat being generated, wherein the plurality of separate cooling systems comprises an air-based cooling system, a liquid-based cooling system and a gas-based cooling system.

13. The data center of claim 12 wherein the optimal fashion is based on a cost associated with the activation of each of the plurality of different cooling systems.

14. The data center of claim 12 wherein the cooling system control module further comprises logic for:
deactivating one or more of the activated plurality of different types of cooling systems within the data center based on a reduction in the amount of heat being generated.

15. The data center of claim 12 wherein an amount of heat being dissipated by the global computer system is a function of an amount of power being consumed by the global computer system.

16. The data center of claim 15 wherein each of the plurality of cooling systems has a cooling capability wherein the cooling capability is a function of an amount of heat that can be removed by the cooling system and the logic for activating each of a plurality of different cooling systems in an optimal fashion further comprises logic for:
activating each of a plurality of different cooling systems based on the amount of heat that can be removed by each of the plurality of cooling systems.

17. The data center of claim 12 wherein the logic for activating each of a plurality of different cooling systems coupled to the global computer system in an optimal fashion further comprises logic for:
activating the air based cooling system before the liquid based cooling system and the gas based cooling system; and
activating the liquid based cooling system before the gas based cooling system.

18. A computer program product for dynamically controlling cooling systems in a global computer system, the computer program product comprising a computer usable medium having computer readable program means for causing a computer to perform the steps of:
determining a workload within the global computer system,
determining an amount of heat being generated as a function of the workload, and activating each of a plurality of different types of separate cooling systems coupled to the global computer system in an optimal fashion based on the amount of heat being generated, wherein the plurality of separate cooling systems comprises an air-based cooling system, a liquid-based cooling system and a gas-based cooling system.

19. The computer program product of claim 18 wherein the optimal fashion is based on a cost associated with the activation of each of the plurality of different cooling systems.

20. The computer program product of claim 18 further comprising means for causing a computer to perform the step of:
   deactivating one or more of the activated plurality of different types of cooling systems within the data center based on a reduction in the amount of heat being generated.

21. The computer program product of claim 18 wherein the step of activating each of a plurality of different cooling systems coupled to the global computer system in an optimal fashion further comprises:
   activating the air-based cooling system before the liquid-based cooling system and the gas-based cooling system; and
   activating the liquid-based cooling system before the gas-based cooling system.

22. A cooling system control module for a data center comprising:
   determination logic for:
   determining a workload within the data center; and
   determining an amount of heat being generated as a function of the workload; and
   activation logic for activating each of a plurality of different types of separate cooling systems within the data center in an optimal fashion based on the amount of heat being generated, wherein the plurality of separate cooling systems comprises an air-based cooling system, a liquid-based cooling system and a gas-based cooling system.

23. The cooling system control module of claim 22 further comprising logic for:
   deactivating one or more of the activated plurality of different types of cooling systems within the data center based on a reduction in the amount of heat being generated.

24. The cooling system control module of claim 22 wherein the logic for activating each of a plurality of different types of cooling systems within the data center in an optimal fashion further comprises logic for:
   activating the air-based cooling system before the liquid-based cooling system and the gas-based cooling system; and
   activating the liquid-based cooling system before the gas-based cooling system.

* * * * *

UNITED STATES PATENT AND TRADEMARK OFFICE
CERTIFICATE OF CORRECTION

| | | |
|---|---|---|
| PATENT NO. | : 7,373,268 B1 | Page 1 of 1 |
| APPLICATION NO. | : 10/632311 | |
| DATED | : May 13, 2008 | |
| INVENTOR(S) | : Marc A. Viredaz et al. | |

It is certified that error appears in the above-identified patent and that said Letters Patent is hereby corrected as shown below:

In column 5, line 1, delete "to" before "input".

In column 8, line 67, in Claim 1, delete "workload," and insert -- workload; --, therefor.

In column 9, lines 1-2, in Claim 1, delete "separates" and insert -- separate --, therefor.

In column 9, line 41, in Claim 7, delete "workload," and insert -- workload; --, therefor.

In column 10, lines 64-65, in Claim 18, delete "system," and insert -- system; --, therefor.

In column 10, line 67, in Claim 18, delete "workload," and insert -- workload; --, therefor.

Signed and Sealed this

Twenty-third Day of June, 2009

JOHN DOLL
*Acting Director of the United States Patent and Trademark Office*